United States Patent [19]

Lacz

[11] Patent Number: 4,674,005
[45] Date of Patent: Jun. 16, 1987

[54] MULTIPLE FASTENING CLIP AND DEVICE FOR THE COLLECTIVE MOUNTING OF ELECTRONIC POWER COMPONENTS

[75] Inventor: Alexandre Lacz, Auterive, France

[73] Assignee: Bendix Electronics S.A., France

[21] Appl. No.: 836,280

[22] Filed: Mar. 5, 1986

[30] Foreign Application Priority Data

Mar. 7, 1985 [FR] France .................. 85 03351

[51] Int. Cl.[4] .................................. H05K 7/20
[52] U.S. Cl. .................... 361/388; 361/403; 174/16 HS
[58] Field of Search ............ 361/388, 403, 386; 174/16 HS; 357/81

[56] References Cited

U.S. PATENT DOCUMENTS

| | | |
|---|---|---|
| 3,654,521 | 4/1972 | LaSelle . |
| 4,204,248 | 5/1980 | Proffit et al. .................. 174/16 HS |
| 4,288,839 | 9/1981 | Prager et al. ..................... 361/386 |
| 4,388,967 | 6/1983 | Breese ............................... 361/386 |
| 4,563,725 | 1/1986 | Kirby ................................. 361/388 |
| 4,609,040 | 9/1986 | Moore ........................... 174/16 HS |

Primary Examiner—Roy N. Envall, Jr.
Attorney, Agent, or Firm—Russel C. Wells; Markell Seitzman

[57] ABSTRACT

The invention relates to a multiple fastening clip (21) and its application to a device for the collective mounting of electronic power components (3) on a heat sink (15). This mounting device comprises a heat sink (15) in the form of an angle section perforated with apertures (18), a dielectric plate (20) interposed between said heat sink (15) and said components (13), and a thermally conductive multiple clip (21) provided with projections intended for cooperating with said apertures (18) in order to secure the clip.

9 Claims, 4 Drawing Figures

MULTIPLE FASTENING CLIP AND DEVICE FOR THE COLLECTIVE MOUNTING OF ELECTRONIC POWER COMPONENTS

The present invention relates to a multiple fastening clip intended to be resiliently placed in position by force particularly for the purpose of effecting the collective mounting of electronic power components on a single heat sink. It also relates to a particular device for the collective mounting of such components with the aid of this clip.

The technical problem in the mounting of electronic power components, connected to a printed circuit, on a heat sink for the dissipation of heat during the operation of the circuit is at the present time solved by two scarcely satisfactory methods. The first method consists in screwing each electronic power component through a heat sink after placing an insulating grommet around the hole formed in the component, in order to insulate the fastening screw. In addition to the fact that this method of mounting must be applied unit by unit and is therefore expensive, it has two main disadvantages: The first is the curvature of the sole of the component, the sole generally being of copper, and the consequent irregularity of the force transmitted through the fastening screw. The second is the creep of the insulating grommet disposed in the hole in the heat sink in the course of utilization at high temperatures, entailing a reduction of the screw connection force and consequently poor fastening of the component on the heat sink.

The second method consists in fastening each power component on the heat sink with the aid of a transverse clip, which makes it necessary to provide a cutout on each side of the component for support purposes. In addition to the space required for a fastening device of this kind, this method must also be applied unit by unit and is therefore expensive.

It is therefore an object of the invention to provide inexpensive and completely reliable means for the collective mounting of a plurality of electronic power components on a heat sink.

According to the present invention there is provided a multiple fastening clip intended to be resiliently placed in position by pressure, characterized in that it is made from a strip of thermally conductive material, cut out to form two series of crenels along the two long sides of the strip and folded on either side of the longitudinal axis of the strip in such a manner that between two consecutive crenels there is defined an element of the clip connected to the following element by a bridge, each element comprising a base from which extend two branches: a first branch in a plane perpendicular to the base, with its end curved towards the outside of the clip to form a hook, and a second branch in a plane inclined towards the curved end of the first branch, with its end likewise folded over outwardly to form a hook, the first branch of at least two elements provided with a barb directed towards the interior of the clip.

The invention further provides a device for the collective mounting of electronic power components on a heat sink with the aid of the clip according to the preceding paragraph, the electronic components being connectd to a printed circuit, while the heat sink and also this printed circuit are intended to be mounted in a casing, said device comprising:

a heat sink in the form of a square angle section, provided with one face perforated by a row of apertures parallel to the edge of the angle section, and provided with means for fastening to the casing;

a sheet of dielectric material of uniform thickness, placed against the perforated face of the heat sink;

a clip resiliently placed in position perforated face of the heat sink and of the electronic components separated form this conductor by the dielectric plate, the projections on the clip being clipped into the apertures in the heat sink.

The invention offers the following advantages:

it is possible for different types of electronic components, of different widths and thickness, to be mounted on the same heat sink with the aid of the same clip, whether these components are aligned close side by side or spaced apart. Moreover, since the insulation is in the form of a sheet, it is simply placed in position by contact between the components and the heat sink, without requiring very accurate operation.

The invention will now be described by way of example with reference to the accompanying drawings in which.

Elements given the same references in the different Figures serve the same functions of the purpose of achieving the same results.

Figure 1:
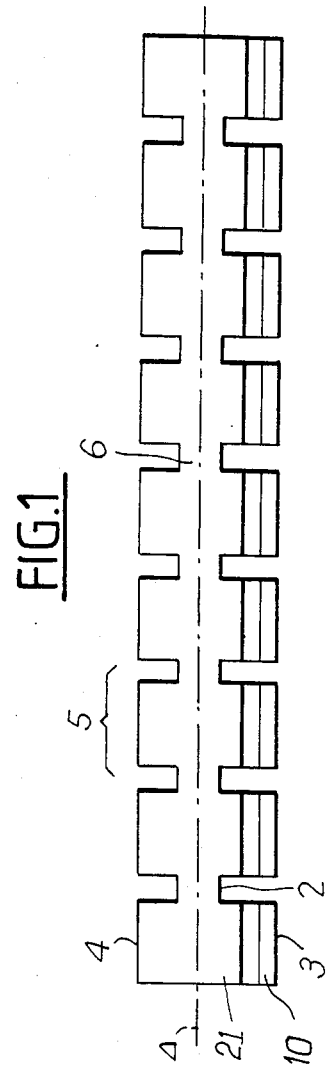
FIG. 1 is an elevation view of a clip according to the invention is made.

The multiple fastening clip 21 according to the invention is made from a rectangular strip of thermally concuctive material, which is cut out, folded and then threated. This material is generally metal, of example, cupro-beryllium alloy or hardened steel. As shown in FIG. 1, the strip has been cut out to form two series of crenellations 2 along the two long sides 3 and 4 of the strip. This strip has then been folded on either side of its longitudinal axis Δ in such manner that between consecutive crenels 2 there is defined an element 5 of the clip. Two consecutive elements 5 are connected by a bridge 6 the width of which makes it possible for each element 5 to have autonomous elasticity and for the clip as a whole to have adequate mechanical strength.

Figure 2A:
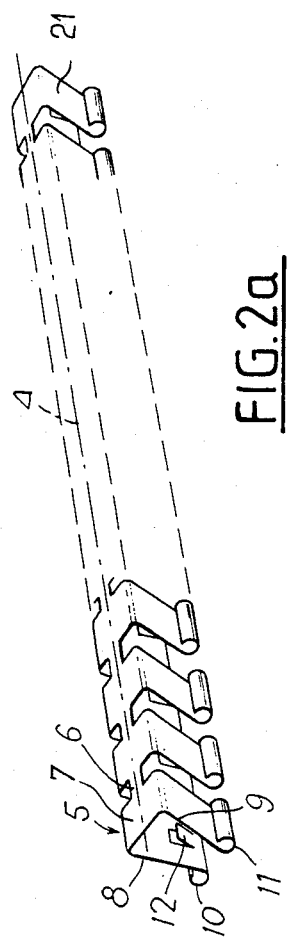
FIGS. 2a and 2b are as perspective view and a cross-sectional view of the same clip according to the invention.
Figure 2B:
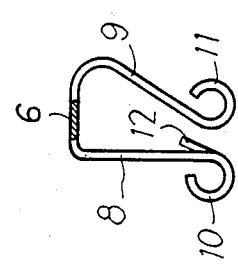

FIGS. 2a and 2b are respectively a view in perpestive and a cross-sectional view of the clip 21. The previously described strip has been folded on either side of the axis Δ in such a manner that each element 5 comprises a base 7 from which extend two branches 8 and 9—the first branch 8 in a plane perpendicular to the base, with its end 10 curved towards the outside of the clip to form a hook. The second branch 9 is inclined towards said curved end 10 of the first branch 8 and in turn has a hook-shaped end 11 curved towards the outside of the clip. In addition, the first branch 8 of each lement has a projection 12 directed towards the interior of the clip. In an other embodiment of the invention (not shown) only two elements 5 of the clip are provided with a projection.

Figure 3:
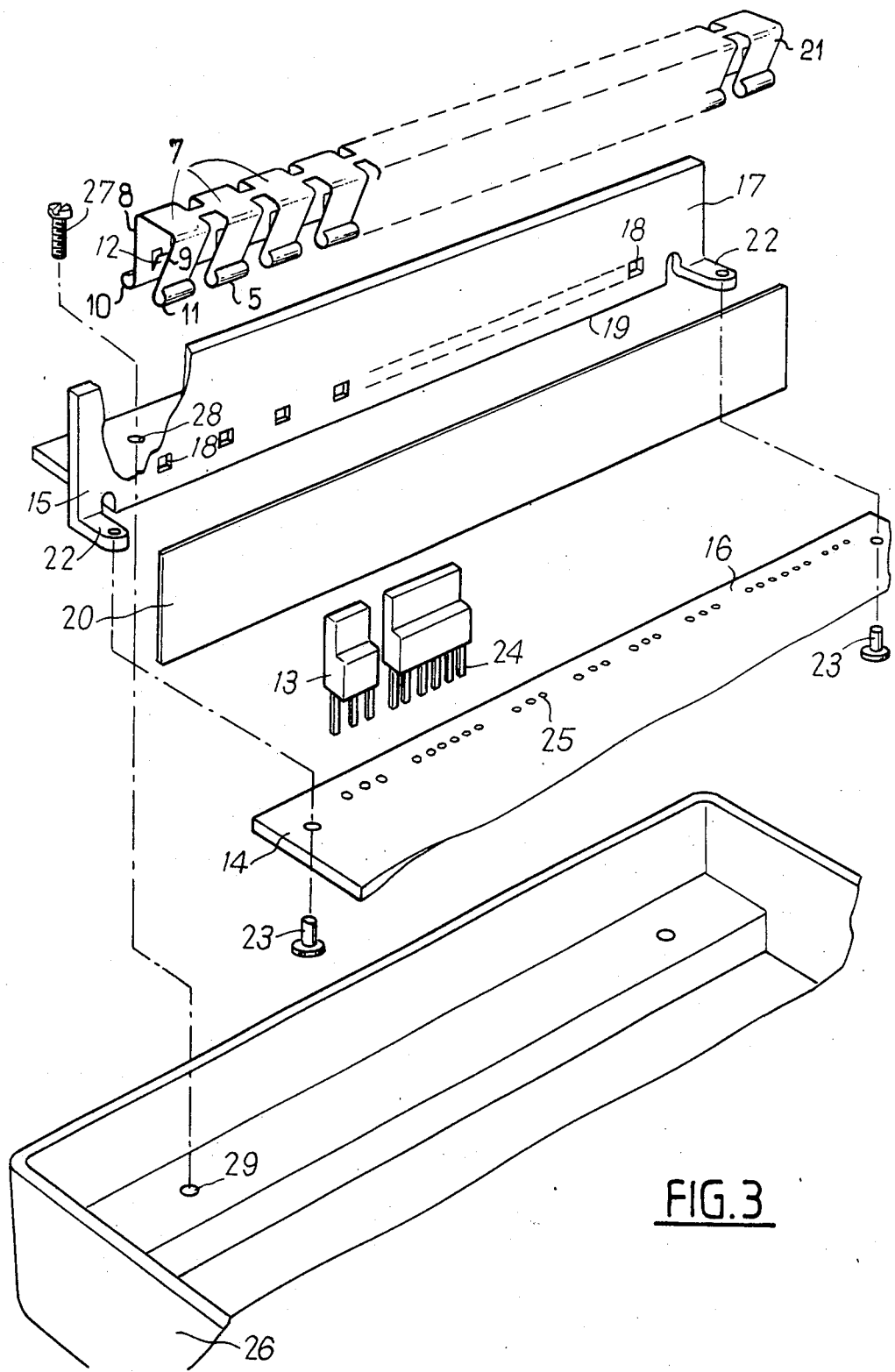
FIG. 3 is an exploded view in perspective of a collective mounting device according to the invention.

FIG. 3 is an exploded view of the device for mounting electronic components with the aid of a multiple clip of the kind just described. It is required to fix electronic power components 13, intended to be connected to a printed circuit 14, to a heat sink 15 whose function is to dissipate the heat produced by the components during their operation. These power components 13 will for this purpose be placed on an edge 16 of the printed circuit in order to ensure good dissipation of heat out of the circuit.

The device for the collective mounting of power components according to the invention comprises firstly a heat sink 15 in the form of a square angle section, of which one face 17 is perforated with a row of equidistant holes 18 parallel to the edge 19 of the angle section. In addition, it comprises a sheet 20 of dielectric material of uniform thickness, and finally a clip 21.

The power components 13 intended to be connected to the printed circuit 16, for example by means of metallized holes 25, are placed against the face 17 of the heat sink 15, but separated from it by the dielectric plate 20, whose function is elecrical insulation between the foot of the components 13 and the heat sink 15, which is generally of metal, without hindering the dissipation of heat. The clip 21 is resiliently placed in position by force, by pressure, to embrace the perforated face 17 of the heat sink and the components 13. The right-angled portion of the clip, comprising the base 7 and the branch 8 of each element 5, permits the positioning of the clip, in respect of heighth. on the heat sink, and its inclined portion comprising the base 7 and the branch 9 enables the components 13 to be placed against the heat sink 15.

The clip is secured in position by the clipping of the projections 12 in the holes 18 in the heat sink, these projections being directed towards the base of the clip in such a manner that they resist its removal. The curved ends 10 and 11 of the clip are used for moving the branches 8 and 9 apart with the aid of needle-nose pliers for the purpose of placing the clip in position or removing it.

The insulating sheet 20, which is retangular in shape and has no openings, can be obtained by cutting from a sheet of mica. It has the same length as the heat sink 15 in order to facilitate visual centering in the horizontal direction.

The heat sink 15 in the form of an angle section can be made from a sheet of copper or aluminium, for example, cut out and folded. It is provided with two lugs 22 at right angles to the perforated face 17, which are perforated with a hole and are intended for cooperation with two screws or rivets 23 for fastening to the printed circuit 14. These two lugs 22 serve in addition as vertical positioning stops for the dielectric sheet 20. For the purpose of holding said dielectric sheet 20 on the heat sink 15 during assembly, it is at least partly coated on one face with a silicone based conductive grease.

Thus, once the power components 13 are held by pressure by means of the clip 21 against the heat sink 15, this assembly is placed above the printed circuit 14 in such a manner that the connections 24 of each component 13 are received in the metallized holes 25 of the circuit 14. The heat sink 15 is then fixed to the printed circuit by rivets 23, and the assembly can be passed over a solder bath in accordance with a conventional wave soldering process.

A printed circuit is generally placed in a protective casing, which may in addition act as a heat radiator. In this case, means for fastening the heat sink 15 to a casing 26 are also provided. These fastening means are for example screws 27 intended to cooperate with holes 28 and 29 formed respectively in the heat sink 15 and the casing 26.

The invention thus permits the collective mounting of electronic power components on the same heat sink, the cost of this arrangement being lower than that of unitary mounting systems of the prior art and its reliability being greater.

I claim:

1. A system for the simultaneous and collective mounting on a heat sink of electronic power components connected to a printed circuit, said system comprising:

a heat sink having a square angle section, provided with one face perforated by a row of apertures parallel to an edge of said angle section, and means for fastening said heat sink to the printed circuit;

a sheet of dielectric material of uniform thickness, placed against said perforated face of said heat sink; and a multiple fastening substantially U-shaped resilient clip resiliently placed in position to embrace said perforated face of said heat sink, said dielectric sheet and the electronic power components, said clip having a plurality of projections along one side of said clip for snappingly engaging in said apertures in said heat sink for securing said clip to said heat sink.

2. The system according to claim 1 wherein said multiple fastening clip is fabricated from a strip of thermally conductive resilient material having two series of crenels along the two long sides of said strip and folded on either side of the longitudinal axis of said strip in such a manner that said crenels are defined an element connected to the following element by a bridge, each of said elements comprising a base from which extend a first branch extending in a plane perpendicular to said base, and having a free end curved towards the outside of said clip, and a second branch extending in a plane inclined towards said curved free end of said first branch, and having a free end curved towards the outside of said clip, said first branch of at least two elements having said projection directed towards the interior of the clip.

3. The system according to claim 1, characterized in that said means for fastening said heat sink to the printed circuit comprises two lugs disposed at the ends of said heat sink and each perforated for receiving with fastening means passing through the printed circuit.

4. The system according to claim 1, additionally including a protective casing, and means for mounting said heat sink thereto for serving as thermal radiator.

5. The system according to claim 1 chracterized in that said clip is fabricated of cuproberyllium alloy.

6. The system according to claim 1, characterized in that said dielectric sheet is of mica.

7. The system according to claim 1, characterized in that said free end of each of said first branch and second branch form an adjustment means in the form of a hook.

8. The system according to claim 1, characterized in that said clip is fabricated of hardened steel.

9. The system according to claim 1, characterized in that the length of said first branch corresponds to height and said heat sinks for positioning said clip on said heat sink and inserting said projections in said apertures.

* * * * *